US012597452B2

(12) United States Patent     (10) Patent No.:   US 12,597,452 B2

Pohlmann     (45) Date of Patent:     Apr. 7, 2026

(54) MINIMUM MEMORY CLOCK ESTIMATION PROCEDURES

(71) Applicant: Micron Technology, Inc., Boise, ID (US)

(72) Inventor: Erik V. Pohlmann, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 246 days.

(21) Appl. No.: 18/201,089

(22) Filed: May 23, 2023

(65) Prior Publication Data

US 2023/0395109 A1     Dec. 7, 2023

Related U.S. Application Data

(60) Provisional application No. 63/347,858, filed on Jun. 1, 2022.

(51) Int. Cl.
    *G11C 7/22*     (2006.01)
    *G11C 7/10*     (2006.01)

(52) U.S. Cl.
    CPC ............ *G11C 7/222* (2013.01); *G11C 7/1093* (2013.01)

(58) Field of Classification Search
    CPC .................................. G11C 7/222; G11C 7/22

USPC ....................................................... 365/233.1
See application file for complete search history.

(56) References Cited

U.S. PATENT DOCUMENTS

| | | | | |
|---|---|---|---|---|
| 2007/0288796 A1* | 12/2007 | Whetsel | ........... | G01R 31/31723 |
| | | | | 714/30 |
| 2013/0258795 A1* | 10/2013 | Wang | ..................... | G11C 7/062 |
| | | | | 365/207 |
| 2015/0235691 A1* | 8/2015 | Kwak | ................. | G11C 11/4076 |
| | | | | 365/194 |
| 2022/0246188 A1* | 8/2022 | Pohlmann | .............. | G11C 7/222 |
| 2022/0253742 A1* | 8/2022 | Zheng | .................... | G06N 10/70 |

* cited by examiner

*Primary Examiner* — Muna A Techane
(74) *Attorney, Agent, or Firm* — Holland & Hart LLP

(57)         ABSTRACT

Methods, systems, and devices for minimum memory clock estimation procedures are described. For instance, a device, such as a host device, may truncate a value of a first parameter associated with a first duration for a clock coupled with a memory array to perform a clock cycle and may determine a value of a second parameter that is inversely proportional to a combination of the truncated first parameter and a correction factor. The device may determine a quantity of clock cycles associated with a second duration for accessing one or more memory cells of the memory array based on adjusting a third parameter associated with the second parameter. The device may access the one or more memory cells of the memory array based on the determined quantity of clock cycles.

17 Claims, 5 Drawing Sheets

205 — Identify a clock rate and determine *tCK(AVG)* based on the clock rate

210 — Truncate *tCK(AVG)*

215 — Determine *ñCK(min)* based on a summation of the truncated *tCK(AVG)* and a first correction factor 220 — Determine *ñCK(min)* based on a summation of the truncated *ñCK(min)* and a second correction factor 225 — Adjust *ñCK(min)* to determine *nCK(min)*

230 — Access one or more memory cells based on *nCK(min)*

200

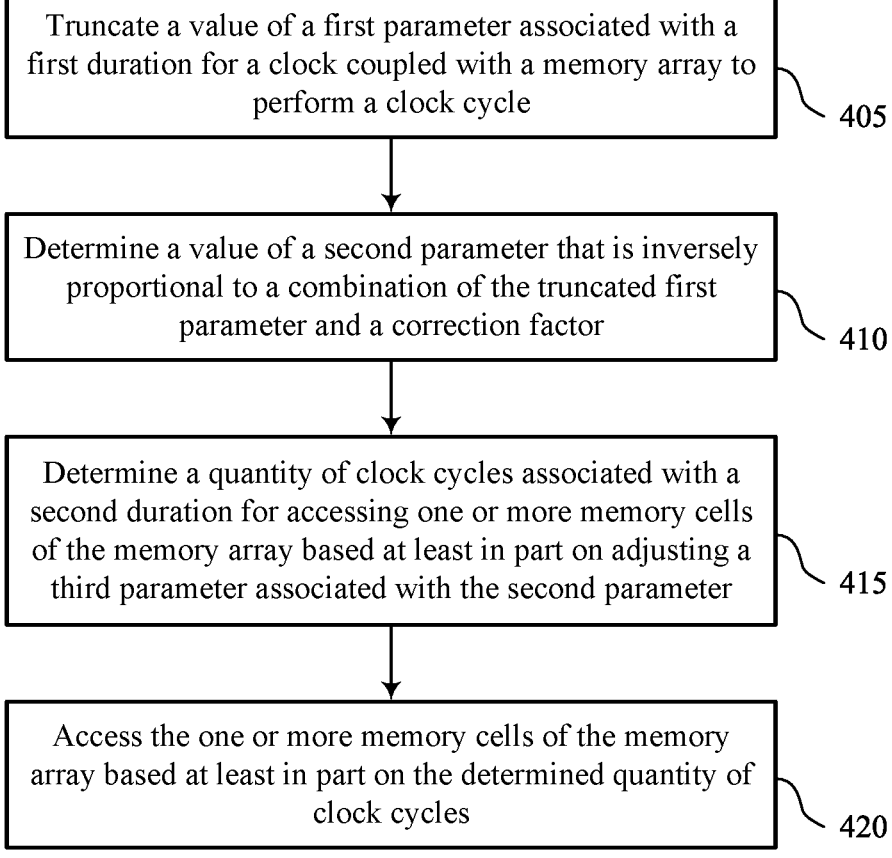

Truncate a value of a first parameter associated with a first duration for a clock coupled with a memory array to perform a clock cycle

405

Determine a value of a second parameter that is inversely proportional to a combination of the truncated first parameter and a correction factor

410

Determine a quantity of clock cycles associated with a second duration for accessing one or more memory cells of the memory array based at least in part on adjusting a third parameter associated with the second parameter

415

Access the one or more memory cells of the memory array based at least in part on the determined quantity of clock cycles

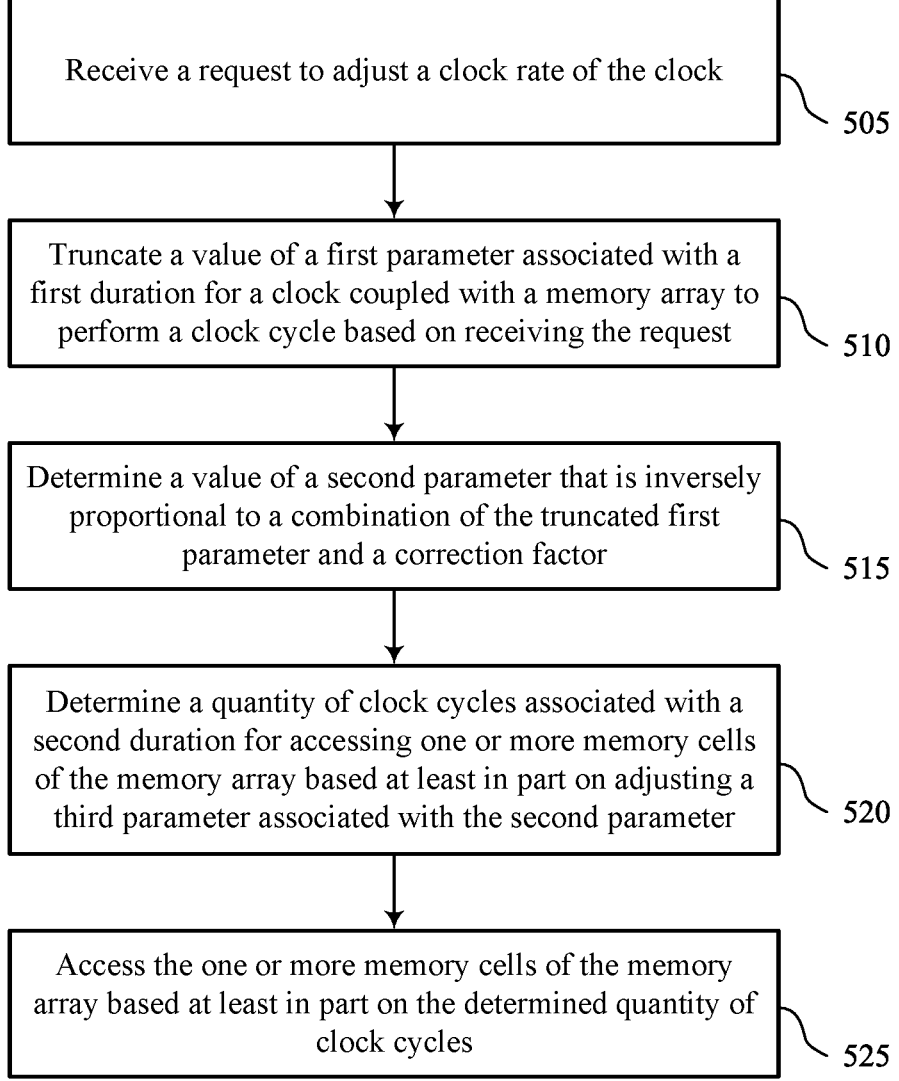

Receive a request to adjust a clock rate of the clock ⟍ 505

Truncate a value of a first parameter associated with a first duration for a clock coupled with a memory array to perform a clock cycle based on receiving the request ⟍ 510

Determine a value of a second parameter that is inversely proportional to a combination of the truncated first parameter and a correction factor ⟍ 515

Determine a quantity of clock cycles associated with a second duration for accessing one or more memory cells of the memory array based at least in part on adjusting a third parameter associated with the second parameter ⟍ 520

Access the one or more memory cells of the memory array based at least in part on the determined quantity of clock cycles ⟍ 525

MINIMUM MEMORY CLOCK ESTIMATION PROCEDURES

The present Application for Patent claims the benefit of U.S. Provisional Patent Application No. 63/347,858 by Pohlmann, entitled "MINIMUM MEMORY CLOCK ESTI-MATION PROCEDURES," filed Jun. 1, 2022, assigned to the assignee hereof, and expressly incorporated by reference herein.

FIELD OF TECHNOLOGY

The following relates to one or more systems for memory, including minimum memory clock estimation procedures.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

BRIEF DESCRIPTION OF THE DRAWINGS

FIGS. 4 and 5 show flowcharts illustrating a method or methods that support minimum memory clock estimation procedures in accordance with examples as disclosed herein.

DETAILED DESCRIPTION

Figure 1:
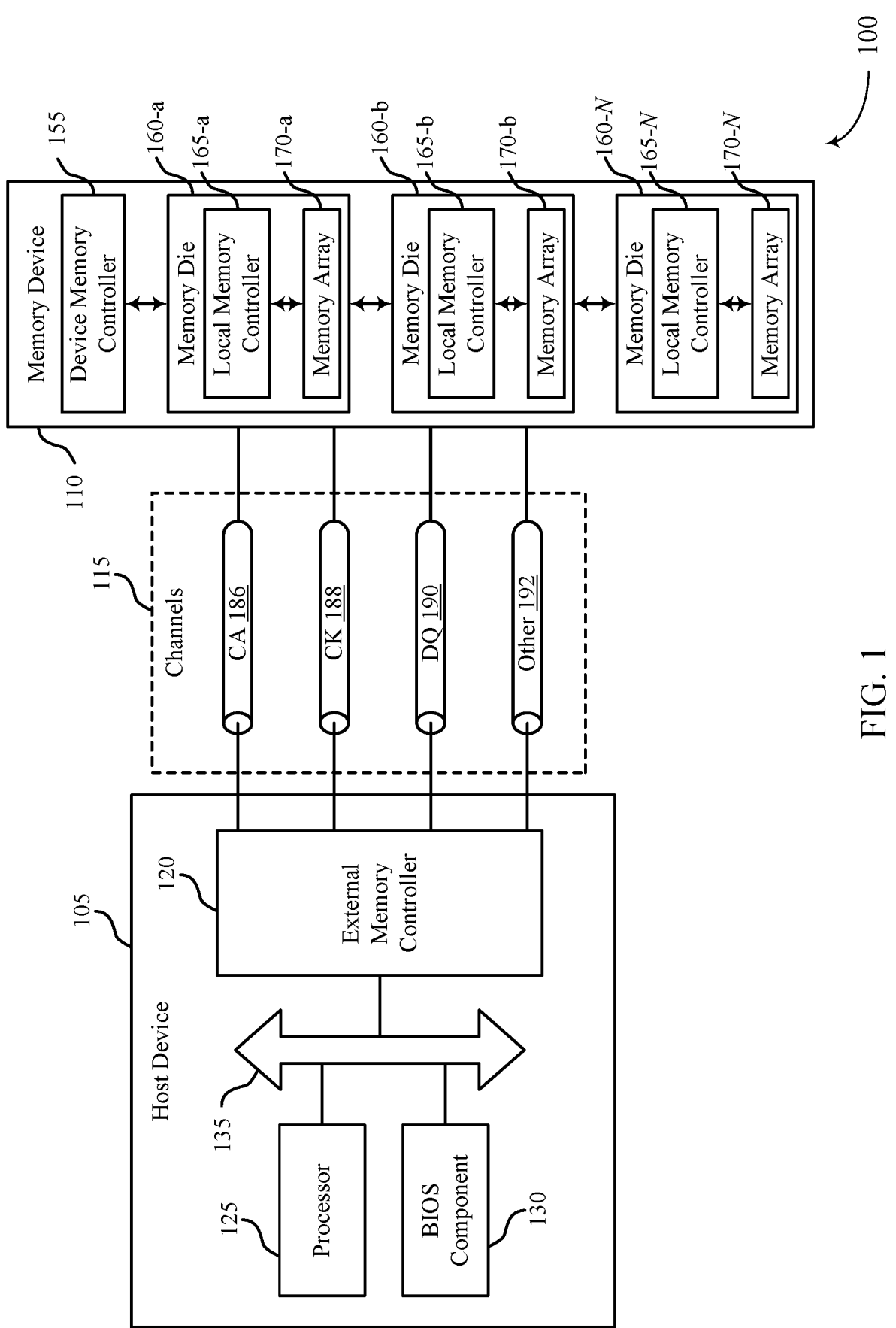
FIG. 1 illustrates an example of a system that supports minimum memory clock estimation procedures in accordance with examples as disclosed herein.

A host device may perform operations using a clock that repeats according to a clock cycle. For instance, the host device may identify a duration associated with accessing one or more memory cells of a memory array of a memory device (e.g., a write recovery delay, a row address to column address delay) and may determine a quantity of clock cycles equivalent in time to the duration. If the host device quantizes (e.g., truncates) a value of the clock cycle, however, the quantity of clock cycles may not be equivalent in time to the identified duration.

In some examples, the host device attempt to determine (e.g., estimate) the quantity of clock cycles that is closest in time to the identified duration. One method by which the host device may attempt to do so may include the host device determining the quantity of clock cycles by determining a ratio inversely proportional to a quantized value of the clock cycle and directly proportional to a correction factor. There may be instances, however, where such an approach may be more computationally complex or computationally intensive compared to other approaches. For instance, combining a correction factor directly proportional to the ratio with a quantized clock cycle duration indirectly proportional to the ratio may be more computationally complex compared to adding a correction factor with the quantized clock cycle duration. Such an increase computational complexity may increase a latency associated with determining the quantity of clock cycles, among other issues.

The examples herein may enable the host device to decrease a computational complexity and decrease a computational intensity associated with determining the quantity of clock cycles. For instance, the examples herein may describe a method of methods in which the host device determines the quantity of clock cycles by determining a ratio related to (e.g., inversely proportional to) a summation of parameters, such as the quantized value of the clock cycle and a correction factor. In some examples, the host device may determine the quantity of clock cycles by quantizing (e.g., truncating) a summation of the ratio with a second correction factor. Determining the quantity of clock cycles in this manner may be less computationally complex compared to alternative methods, such as determining the quantity of clock cycles by combining a correction factor directly proportional with the ratio with the quantity of clock cycles that is inversely proportional with the ratio. Accordingly, the methods described herein may enable the host device to more quickly determine the quantity of clock cycles, which may increase the performance of the host device, among other advantages.

Features of the disclosure are initially described in the context of a system as described with reference to FIG. 1. Features of the disclosure are described in the context a process flow as described with reference to FIG. 2. These and other features of the disclosure are further illustrated by and described with reference to an apparatus diagram and flowcharts that relate to minimum memory clock estimation procedures as described with reference to FIGS. 3-5.

FIG. 1 illustrates an example of a system 100 that supports minimum memory clock estimation procedures in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

In some examples, the system 100 or the host device 105 may include various peripheral components. The peripheral components may be any input device or output device, or an interface (e.g., a bus, a set of pins) for such devices, that may be integrated into or with the system 100 or the host device 105. Examples may include one or more of: a disk controller, a sound controller, a graphics controller, an Ethernet controller, a modem, a universal serial bus (USB) controller, a serial or parallel port, or a peripheral card slot such as peripheral component interconnect (PCI) or specialized graphics ports. The peripheral component(s) may be other components understood by a person having ordinary skill in the art as a peripheral.

In some examples, the system 100 or the host device 105 may include an I/O controller. An I/O controller may manage data communication between the processor 125 and the peripheral component(s), input devices, or output devices. The I/O controller may manage peripherals that are not integrated into or with the system 100 or the host device 105. In some examples, the I/O controller may represent a physical connection or port to external peripheral components.

In some examples, the system 100 or the host device 105 may include an input component, an output component, or both. An input component may represent a device or signal external to the system 100 that provides information, signals, or data to the system 100 or its components. In some examples, and input component may include a user interface or interface with or between other devices. In some examples, an input component may be a peripheral that interfaces with system 100 via one or more peripheral components or may be managed by an I/O controller. An output component may represent a device or signal external to the system 100 operable to receive an output from the system 100 or any of its components. Examples of an output component may include a display, audio speakers, a printing device, another processor on a printed circuit board, and others. In some examples, an output may be a peripheral that interfaces with the system 100 via one or more peripheral components or may be managed by an I/O controller.

The memory device 110 may include a device memory controller 155 and one or more memory dies 160 (e.g., memory chips) to support a desired capacity or a specified capacity for data storage. Each memory die 160 (memory dies 160-*a*, 160-*b*, and 160-N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells.

A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory die 160 may include any quantity of stacked memory arrays 170 (e.g., two high, three high, four high, five high, six high, seven high, eight high). In some 3D memory dies 160, different decks may share at least one common access line such that some decks may share one or more of a word line, a digit line, or a plate line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths to decode one or more of address or command data (e.g., eight or nine signal paths).

In some examples, clock signal channels 188 may be operable to communicate one or more clock signals between the host device 105 and the memory device 110. Each clock signal may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

In some examples, data channels 190 may be operable to communicate one or more of data or control information between the host device 105 and the memory device 110. For example, the data channels 190 may communicate information (e.g., bi-directional) to be written to the memory device 110 or information read from the memory device 110.

The channels 115 may include any quantity of signal paths (including a single signal path). In some examples, a channel 115 may include multiple individual signal paths. For example, a channel may be ×4 (e.g., including four signal paths), ×8 (e.g., including eight signal paths), ×16 (including sixteen signal paths), etc.

In some examples, the one or more other channels 192 may include one or more error detection code (EDC) channels. The EDC channels may be operable to communicate error detection signals, such as checksums, to improve system reliability. An EDC channel may include any quantity of signal paths.

Signals communicated over the channels 115 may be modulated using one or more different modulation schemes. In some examples, a binary-symbol (or binary-level) modulation scheme may be used to modulate signals communicated between the host device 105 and the memory device 110. A binary-symbol modulation scheme may be an example of a M-ary modulation scheme where M is equal to two. Each symbol of a binary-symbol modulation scheme may be operable to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some examples, a multi-symbol (or multi-level) modulation scheme may be used to modulate signals communicated between the host device 105 and the memory device 110. A multi-symbol modulation scheme may be an example of a M-ary modulation scheme where M is greater than or equal to three. Each symbol of a multi-symbol modulation scheme may be operable to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., a PAM3 signal or a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

In some examples, a host device 105 or a memory device 110 may perform operations using a clock that repeats according to a clock cycle. For instance, the host device 105 or memory device 110 may identify a duration associated with accessing one or more memory cells of a memory array 170 (e.g., a write recovery delay, a row address to column address delay) and may determine a quantity of clock cycles equivalent in time to the duration. In some examples, the host device may access (e.g., read, retrieve data from) a register (e.g., a serial presence detect (SPD) register) of the memory device to identify the duration associated with accessing the one or more memory cells of the memory array. Additionally or alternatively, the host device may access memory cells of the memory device to identify the duration. If the host device 105 or the memory device 110 quantizes (e.g., truncate) a value of the clock cycle, however, the quantity of clock cycles may not be equivalent in time to the identified duration.

Methods for calculation of timing parameters may be subject to rounding errors from one or more sources. For example, a system (e.g., a host device 105, a memory device 110) may use a memory clock with a particular nominal frequency (e.g., 2200 megahertz or 4400 million transfers per second) for a speed bin, which may mathematically yield a particular clock period (e.g., 0.454545 nanoseconds repeating). In some examples, it is impossible or practically difficult to express each digit after the decimal point exactly and rounding may be used by the host device or the memory device to simplify the method or methods. The timing parameters may, in some examples, have a minimum granularity (e.g., 1 picosecond).

Methods for rounding may be defined to enable improved performance (e.g., optimization of device performance) without violating device parameters (e.g., an industry standard or specification). Each timing parameter may be specified in the time domain (e.g., in nanoseconds, picoseconds), which may then be converted to the clock domain (e.g., nCK units), and may be defined to align with (e.g., follow, use) these methods. The timing parameters (e.g., minimum timing parameters, maximum timing parameters) may use the same or similar rounding methods used to define an application memory clock period (e.g., a minimum application memory clock period such as tCK(AVG)min or a maximum application memory clock period). The resulting rounding methods may rely on results that are within correction factors (e.g., of device testing and/or specification) to avoid losing performance due to rounding errors.

Such rules or methods may include that one or more timing parameter values (e.g., one or more minimum timing parameter values such as tCK(AVG)min) may be rounded down and defined to a particular granularity (e.g., 1 picosecond) of accuracy based on a non-rounded nominal value, such as a tCK(AVG)min value, for a given speed bin. If the nominal value, such as the nominal timing parameter (e.g., minimum timing parameter) value, is to use more than the particular granularity (e.g., 1 picosecond) of accuracy, the nominal timing parameter value may be rounded down to the next value of the particular granularity (e.g., 1 picosecond) according to the rounding algorithms or methods.

Rounding down may, in some examples, may be used to calculate clock domain values, such as number of clocks nCK values. For instance, a method may including using scaling, for example by 1000, to enable the use of integer math. The nominal parameter (e.g., nominal minimum parameter), in picoseconds, may be multiplied by a scaled correction factor (e.g., 1000−3=997) before dividing by the application memory clock period. Adding 1000 to the result may round the result up. Dividing by 1000 after adding 1000 may counteract the scaling effect and may result in a simple integer quantity of clocks (e.g., clock cycles). If the result is equal to an integer (e.g., a whole number), the result may not be rounded down as intended and performance may be lost. To address this, the correction factor may be increased from one value to another value (e.g., from 0.28% to 0.3%). Doing so, in some examples, may account for integer boundary conditions. Additional methods may be used if the nominal timing parameter (e.g., nominal minimum timing parameter) value is defined as 0 picoseconds. In some examples, the quantity of clocks may be determined as:

$$nCK(\text{min}) =$$

$$\text{truncate}\left[\frac{\left(\dfrac{\text{truncate(nominal\_min\_parameter\_in\_ps)} *}{\text{truncate}(tCK(AVG)\text{real\_in\_ps})}\right) + 1000}{1000}\right],$$

where the nominal_min_parameter_in_ps may correspond to a nominal minimum parameter (e.g., nominal minimum parameters like tWRmin or tRCDmin in units of picoseconds), the correction_factor may correspond to a value of the correction factor (e.g., 997), and the tCK(AVG)real_in_ps may correspond to a real application memory clock period in units of picoseconds.

However, as described herein, performing the rounding down in this manner may be more computationally complex than other methods. For instance, performing the rounding down in this manner may involve multiplying a minimum timing parameter with a correction factor and may also include dividing by 1000, both or either of which may involve the host device 105 or the memory device 110 performing one or more operations. As such, methods that do not involve the host device 105 or the memory device 110 performing these operations may, in some examples, be associated with a lower computational complexity. For instance, the host device 105 or the memory device 110 may determine a ratio by quantizing a nominal minimum timing parameter (e.g., rounded down, truncated) and dividing the quantized nominal minimum timing parameter by a summation of a quantized (e.g., rounded down, truncated) application memory clock period and a correction factor. In some examples, the nominal minimum timing parameter and the application memory clock period may be quantized to 1 picosecond (ps) and the correction factor may equal 1 picosecond. Additionally, the host device 105 or the memory device 110 may determine a number of clock cycles by quantizing (e.g., rounding down, truncating) a summation of a second correction factor with the ratio. In some examples, the host device 105 or the memory device 110 may quantize the number of clock cycles to a next clock cycle value. In some examples, the quantity of clocks may be determined as:

$$nCK(\text{min}) =$$

$$\text{truncate}\left[\left(\frac{\text{truncate(nominal\_min\_parameter\_in\_ps)}}{\text{truncate}(tCK(AVG)\text{real\_in\_ps}) + \text{correction\_factor}}\right) + 1\right],$$

where the nominal_min_parameter_in_ps may correspond to a nominal minimum parameter (e.g., nominal minimum parameters like tWRmin or tRCDmin in units of picoseconds), the correction_factor may correspond to a value of the correction factor (e.g., 1), and the tCK(AVG)real_in_ps may correspond to a real application memory clock period in units of picoseconds.

A host device 105 or a memory device 110 implementing the methods as described herein may be associated with one or more advantages. For instance, determining the quantity of clock cycles in this manner may be less computationally complex as opposed to alternative methods, such as determining the quantity of clock cycles by combining a correction factor directly proportional with the ratio with the quantity of clock cycles that is inversely proportional with the ratio. Accordingly, the methods described herein may enable the host device to more quickly determine the quantity of clock cycles, which may increase the performance of the host device. Additional details about implementing the methods described herein may be described with reference to FIG. 2.

Figure 2:
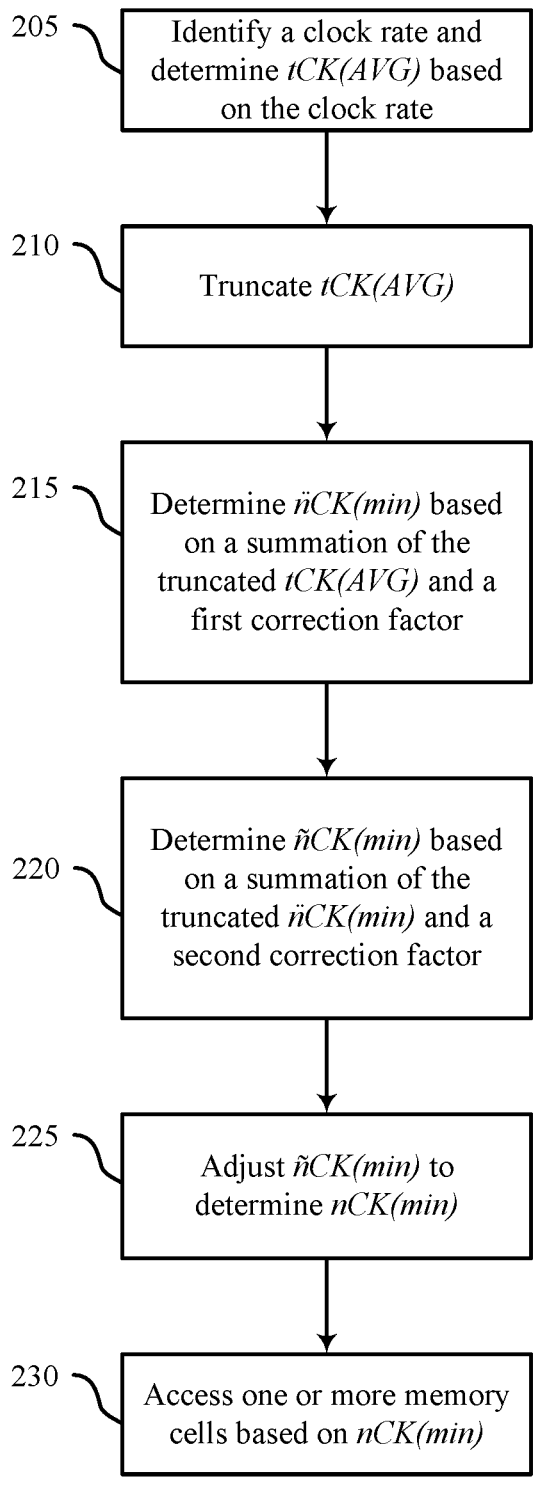
FIG. 2 illustrates an example of a process flow that supports minimum memory clock estimation procedures in accordance with examples as disclosed herein.

FIG. 2 illustrates an example of a process flow 200 that supports memory clock management and estimation procedures in accordance with examples as disclosed herein. In some examples, one or more components may perform various aspects of the process flow 200. For instance, an external memory controller (e.g., an external memory controller 120 of a host device 105 as described with reference to FIG. 1), a device memory controller (e.g., a device memory controller 155 as described with reference to FIG. 1) of the memory device, a local memory controller (e.g., a local memory controller 165 as described with reference to FIG. 1), or any combination thereof may perform the methods associated with process flow 200.

As described herein (e.g., with reference to FIG. 1), a host device or a memory device may perform operations using a clock that repeats according to a clock cycle. For instance, the host device or the memory device may identify a duration (e.g., as stored on an SPD of the memory device) associated with accessing one or more memory cells of a memory array (e.g., a write recovery delay, a row address to column address delay) and may determine a quantity of clock cycles that corresponds to (e.g., is less than, is equal to, is greater than) the identified duration. The methods as described herein (e.g., with reference to FIG. 2) may enable a host device or a memory device to determine the quantity of clock cycles that corresponds to the identified duration.

At 205, the host device or the memory device may identify (e.g., select) a clock rate (e.g., a clock rate of the host device that is compatible with a clock rate indicated by a register, such as an SPD, or one or more memory cells of the memory device) and may determine the value of a first parameter associated with a first duration for a clock to perform a clock cycle (e.g., tCK(AVG)real_in_ps, which may be an example of a real application memory clock period) based on the clock rate. For instance, the value of the first parameter may be an inverse of a value of the clock rate. In some examples, the host device or the memory device may identify the clock rate based on receiving a request (e.g., from a host device) to adjust to the clock rate. Additionally or alternatively, the host device or the memory device may identify a condition at the host device or the memory device and may adjust the clock rate based on the condition.

At 210, the host device or the memory device may truncate the value of the first parameter. For instance, the host device or the memory device may perform truncate (tCK(AVG)real_in_ps). In some examples, the host device or the memory device may truncate the first parameter to a particular granularity (e.g., to the picosecond level).

At 215, the host device or the memory device may determine a value of a second parameter (e.g., ñCK) based on the truncated value of the first parameter (e.g., truncate (tCK(AVG)real_in_ps)) and a first correction factor (e.g., correction_factor). For instance, the second parameter may be inversely proportional to a summation of the truncated value of the first parameter and the first correction factor. In some examples, the second parameter may be directly proportional to a third parameter (e.g., truncate(nominal_min_parameter_in_ps)) associated with accessing the one or more memory cells of the memory array. In some examples, the third parameter may be determined based on truncating a fourth parameter (e.g., nominal_min_parameter_in_ps). The second parameter may be determined as:

$$\tilde{n}CK = \frac{\text{truncate(parameter\_nominal\_in\_ps)}}{\text{truncate}(tCK(AVG)\text{real\_in\_pa}) + \text{correction\_factor}}$$

In some examples, the correction factor may include or be an example of a factor by which the second parameter is corrected. In some examples, for a write recovery delay, nominal_min_parameter_in_ps may equal 30000 picoseconds and, for a column to column command delay (e.g., tCCD), nominal_min_parameter_in_ps may equal 5000 picoseconds. In some examples, correction_factor may be equal to 1. In some examples, nominal_min_parameter-_in_ps and tCK(AVG)real_in_ps may not be truncated prior to determination of the second parameter (e.g., ñCK).

At 220, the host device or the memory device may determine a fifth parameter (e.g., ñCK) based on a summation of the second parameter (e.g., ñCK) and a second correction factor (e.g., 1). For instance, the host device or the memory device may combine the second parameter and the second correction factor. The host device or the memory device may determine the fifth parameter as: ñCK=ñCK+1.

At 225, the host device or the memory device may determine a quantity of clock cycles (e.g., nCK) associated with a second duration for accessing one or more memory cells of the memory array based on adjusting the third parameter. For instance, the host device or the memory device may adjust, based on determining the value of the second parameter, the third parameter from a first value to a second value lower than the first value. Additionally or alternatively, the host device or the memory device may truncate the first value of the third parameter based on determining the value of the second parameter. The host device or the memory device may determine the quantity of clock cycles as: nCK=truncate(ñCK). In some examples, the second duration may correspond to a write recovery delay (e.g., tWRmin) or a row address to column address delay (e.g., tRCDmin).

At 230, the host device or the memory device may access the one or more memory cells of the memory array based on the determined quantity of clock cycles. For instance, the host device or the memory device may employ a delay (e.g., tWRmin, tRCDmin) while performing an access operation, such as a read, a write, an activate, or a precharge, on the one or more cells according to the determined quantity of clock cycles.

A host device or a memory device implementing the methods as described herein (e.g., with reference to FIG. 2) may be associated with one or more advantages. For instance, determining a quantity of clock cycles according to the methods described herein may be less computationally complex as compared to alternative methods, such as determining the quantity of clock cycles by multiplying a correction factor with the third parameter. Accordingly, the methods described herein may enable the host device to more quickly determine the quantity of clock cycles, which may increase the performance of the host device or the memory device, among other advantages.

Figure 3:
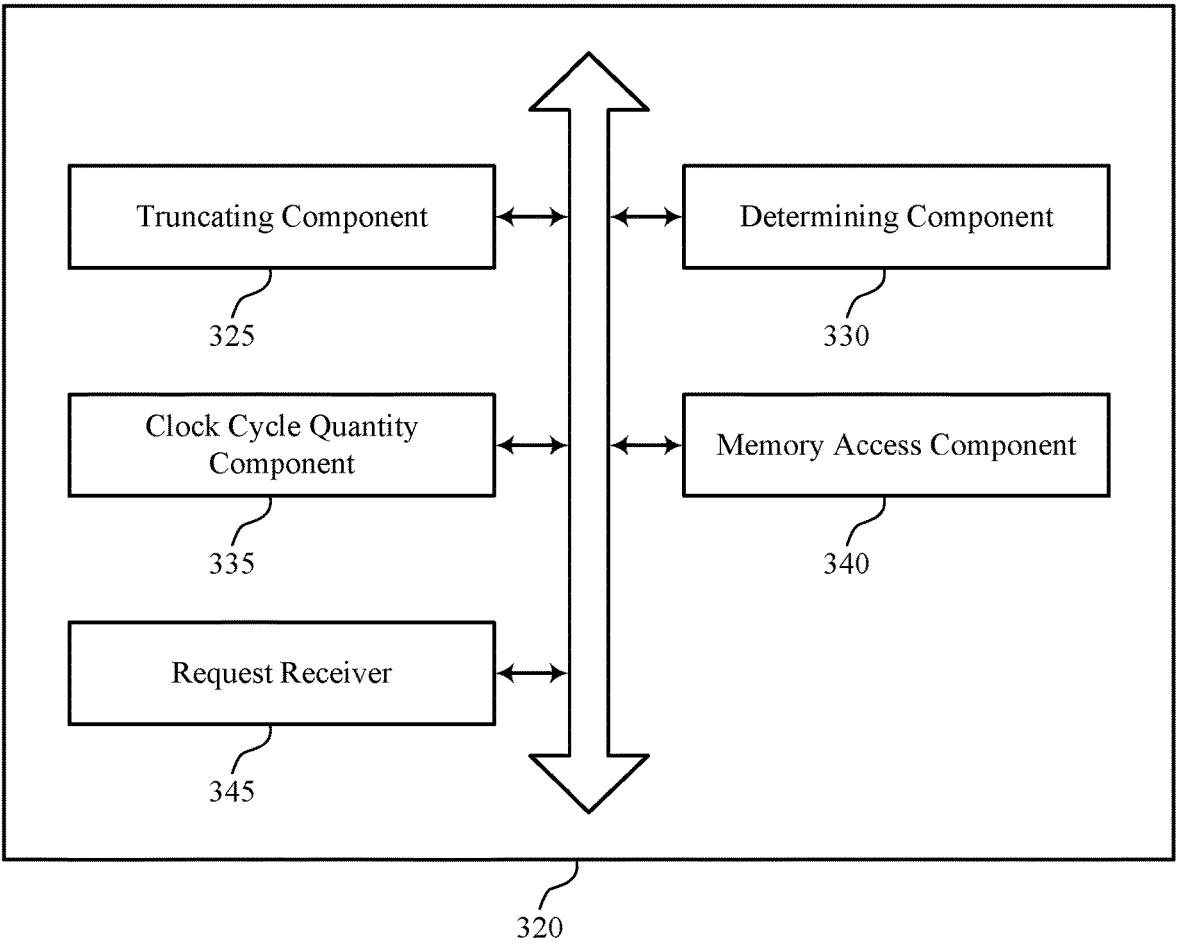
FIG. 3 shows a block diagram of a device that supports minimum memory clock estimation procedures in accordance with examples as disclosed herein.

FIG. 3 shows a block diagram 300 of a device 320 that supports minimum memory clock estimation procedures in accordance with examples as disclosed herein. The device 320 may be an example of aspects of a device as described with reference to FIGS. 1 through 3. The device 320, or various components thereof, may be an example of means for performing various aspects of minimum memory clock estimation procedures as described herein. For example, the device 320 may include a truncating component 325, an determining component 330, a clock cycle quantity component 335, a memory access component 340, a request receiver 345, or any combination thereof. Each of these components may communicate, directly or indirectly, with one another (e.g., via one or more buses).

The truncating component 325 may be configured as or otherwise support a means for truncating (e.g., a circuit or controller configured to truncate) a value of a first parameter associated with a first duration for a clock coupled with a memory array to perform a clock cycle. The determining component 330 may be configured as or otherwise support a means for determining (e.g., a circuit or controller configured to determine) a value of a second parameter that is inversely proportional to a combination of the truncated first parameter and a correction factor. The clock cycle quantity component 335 may be configured as or otherwise support a means for determining (e.g., a circuit or controller configured to determine) a quantity of clock cycles associated with a second duration for accessing one or more memory cells of the memory array based at least in part on adjusting a third parameter associated with the second parameter. The memory access component 340 may be configured as or otherwise support a means for accessing (e.g., a circuit or controller configured to access) the one or more memory cells of the memory array based at least in part on the determined quantity of clock cycles.

In some examples, the request receiver 345 may be configured as or otherwise support a means for receiving (e.g., a circuit or controller configured to receive) a request to adjust a clock rate of the clock, where truncating the value of the first parameter is based at least in part on receiving the request.

In some examples, to support accessing the one or more memory cells of the memory array based at least in part on the determined quantity of clock cycles, the memory access component 340 may be configured as or otherwise support a means for accessing (e.g., a circuit or controller configured to access) the one or more memory cells over a total quantity of clock cycles that is greater than or equal to the determined quantity of clock cycles.

In some examples, the truncating component 325 may be configured as or otherwise support a means for truncating (e.g., a circuit or controller configured to truncate) a value of the third parameter based at least in part on determining the value of the second parameter, where determining the quantity of clock cycles is based at least in part on truncating the value of the third parameter.

In some examples, the determining component 330 may be configured as or otherwise support a means for determining (e.g., a circuit or controller configured to determine) the third parameter based at least in part on combining the second parameter and a second correction factor, where adjusting the third parameter is based at least in part on determining the third parameter.

In some examples, the second parameter is directly proportional to a fourth parameter associated with a total duration for performing a memory operation, and the truncating component 325 may be configured as or otherwise support a means for truncating (e.g., a circuit or controller configured to truncate) a value of a fifth parameter to generate the fourth parameter.

In some examples, the quantity of clock cycles corresponds to an upper bound of clock cycles for accessing the one or more memory cells.

In some examples, the second duration for accessing the one or more memory cells corresponds to a write recovery delay or a row address to column address delay.

FIG. 4 shows a flowchart illustrating a method 400 that supports minimum memory clock estimation procedures in accordance with examples as disclosed herein. The operations of method 400 may be implemented by a device or its components as described herein. For example, the operations of method 400 may be performed by a device as described with reference to FIGS. 1 through 3. In some examples, a device may execute a set of instructions to control the functional elements of the device to perform the described functions. Additionally, or alternatively, the device may perform aspects of the described functions using special-purpose hardware.

At 405, the method may include truncating a value of a first parameter associated with a first duration for a clock coupled with a memory array to perform a clock cycle. The operations of 405 may be performed in accordance with examples as disclosed herein. In some examples, aspects of the operations of 405 may be performed by a truncating component 325 as described with reference to FIG. 3.

At 410, the method may include determining a value of a second parameter that is inversely proportional to a combination of the truncated first parameter and a correction factor. The operations of 410 may be performed in accordance with examples as disclosed herein. In some examples, aspects of the operations of 410 may be performed by an determining component 330 as described with reference to FIG. 3.

At 415, the method may include determining a quantity of clock cycles associated with a second duration for accessing one or more memory cells of the memory array based at least in part on adjusting a third parameter associated with the second parameter. The operations of 415 may be performed in accordance with examples as disclosed herein. In some examples, aspects of the operations of 415 may be performed by a clock cycle quantity component 335 as described with reference to FIG. 3.

At 420, the method may include accessing the one or more memory cells of the memory array based at least in part on the determined quantity of clock cycles. The operations of 420 may be performed in accordance with examples as disclosed herein. In some examples, aspects of the operations of 420 may be performed by a memory access component 340 as described with reference to FIG. 3.

In some examples, an apparatus as described herein may perform a method or methods, such as the method 400. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for truncating a value of a first parameter associated with a first duration for a clock coupled with a memory array to perform a clock cycle; determining a value of a second parameter that is inversely proportional to a combination of the truncated first parameter and a correction factor; determining a quantity of clock cycles associated with a second duration for accessing one or more memory cells of the memory array based at least in part on adjusting a third parameter associated with the second parameter; and accessing the one or more memory cells of the memory array based at least in part on the determined quantity of clock cycles.

Aspect 2: The method, apparatus, or non-transitory computer-readable medium of aspect 1, further including operations, features, circuitry, logic, means, or instructions, or any combination thereof for receiving a request to adjust a clock rate of the clock, where truncating the value of the first parameter is based at least in part on receiving the request.

Aspect 3: The method, apparatus, or non-transitory computer-readable medium of any of aspects 1 through 2 where accessing the one or more memory cells of the memory array based at least in part on the determined quantity of clock cycles includes operations, features, circuitry, logic, means, or instructions, or any combination thereof for accessing the one or more memory cells over a total quantity of clock cycles that is greater than or equal to the determined quantity of clock cycles.

Aspect 4: The method, apparatus, or non-transitory computer-readable medium of any of aspects 1 through 3, further including operations, features, circuitry, logic, means, or instructions, or any combination thereof for truncating a value of the third parameter based at least in part on determining the value of the second parameter, where determining the quantity of clock cycles is based at least in part on truncating the value of the third parameter.

Aspect 5: The method, apparatus, or non-transitory computer-readable medium of any of aspects 1 through 4, further including operations, features, circuitry, logic, means, or instructions, or any combination thereof for determining the third parameter based at least in part on combining the second parameter and a second correction factor, where adjusting the third parameter is based at least in part on determining the third parameter.

Aspect 6: The method, apparatus, or non-transitory computer-readable medium of any of aspects 1 through 5 where the second parameter is directly proportional to a fourth parameter associated with a total duration for performing a memory operation and the method, apparatuses, and non-transitory computer-readable medium, further includes operations, features, circuitry, logic, means, or instructions, or any combination thereof for truncating a value of a fifth parameter to generate the fourth parameter.

Aspect 7: The method, apparatus, or non-transitory computer-readable medium of any of aspects 1 through 6 where the quantity of clock cycles corresponds to an upper bound of clock cycles for accessing the one or more memory cells.

Aspect 8: The method, apparatus, or non-transitory computer-readable medium of any of aspects 1 through 7 where the second duration for accessing the one or more memory cells corresponds to a write recovery delay or a row address to column address delay.

FIG. 5 shows a flowchart illustrating a method 500 that supports minimum memory clock estimation procedures in accordance with examples as disclosed herein. The operations of method 500 may be implemented by a device or its components as described herein. For example, the operations of method 500 may be performed by a device as described with reference to FIGS. 1 through 3. In some examples, a device may execute a set of instructions to control the functional elements of the device to perform the described functions. Additionally, or alternatively, the device may perform aspects of the described functions using special-purpose hardware.

At 505, the method may include receiving a request to adjust a clock rate of the clock. The operations of 505 may be performed in accordance with examples as disclosed herein. In some examples, aspects of the operations of 505 may be performed by a request receiver 345 as described with reference to FIG. 3.

At 510, the method may include truncating a value of a first parameter associated with a first duration for a clock coupled with a memory array to perform a clock cycle based on receiving the request. The operations of 510 may be performed in accordance with examples as disclosed herein. In some examples, aspects of the operations of 510 may be performed by a truncating component 325 as described with reference to FIG. 3.

At 515, the method may include determining a value of a second parameter that is inversely proportional to a combination of the truncated first parameter and a correction factor. The operations of 515 may be performed in accordance with examples as disclosed herein. In some examples, aspects of the operations of 515 may be performed by an determining component 330 as described with reference to FIG. 3.

At 520, the method may include determining a quantity of clock cycles associated with a second duration for accessing one or more memory cells of the memory array based at least in part on adjusting a third parameter associated with the second parameter. The operations of 520 may be performed in accordance with examples as disclosed herein. In some examples, aspects of the operations of 520 may be performed by a clock cycle quantity component 335 as described with reference to FIG. 3.

At 525, the method may include accessing the one or more memory cells of the memory array based at least in part on the determined quantity of clock cycles. The operations of 525 may be performed in accordance with examples as disclosed herein. In some examples, aspects of the operations of 525 may be performed by a memory access component 340 as described with reference to FIG. 3.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 9: An apparatus, including: a memory array including an array of memory cells that each include capacitive storage elements; and a circuit coupled with the memory array and configured to cause the apparatus to: truncate a value of a first parameter associated with a first duration for a clock coupled with the memory array to perform a clock cycle; determine a value of a second parameter that is inversely proportional to a combination of the truncated first parameter and a correction factor; determine a quantity of clock cycles associated with a second duration for accessing one or more memory cells of the memory array based at least in part on adjusting a third parameter associated with the second parameter; and access the one or more memory cells of the memory array based at least in part on the determined quantity of clock cycles.

Aspect 10: The apparatus of aspect 9, where the circuit is further configured to cause the apparatus to: receive a request to adjust a clock rate of the clock, where truncating the value of the first parameter is based at least in part on receiving the request.

Aspect 11: The apparatus of any of aspects 9 through 10, where the circuit accessing the one or more memory cells of the memory array based at least in part on the determined quantity of clock cycles is configured to cause the apparatus to: access the one or more memory cells over a total quantity of clock cycles that is greater than or equal to the determined quantity of clock cycles.

Aspect 12: The apparatus of any of aspects 9 through 11, where the circuit is further configured to cause the apparatus to: truncate a value of the third parameter based at least in part on determining the value of the second parameter, where determining the quantity of clock cycles is based at least in part on truncating the value of the third parameter.

Aspect 13: The apparatus of any of aspects 9 through 12, where the circuit is further configured to cause the apparatus to: determine the third parameter based at least in part on combining the second parameter and a second correction factor, where adjusting the third parameter is based at least in part on determining the third parameter.

Aspect 14: The apparatus of any of aspects 9 through 13, where the second parameter is directly proportional to a fourth parameter associated with a total duration for performing a memory operation, and the circuit is further configured to cause the apparatus to: truncate a value of a fifth parameter to generate the fourth parameter.

Aspect 15: The apparatus of any of aspects 9 through 14, where the quantity of clock cycles corresponds to an upper bound of clock cycles for accessing the one or more memory cells.

Aspect 16: The apparatus of any of aspects 9 through 15, where the second duration for accessing the one or more memory cells corresponds to a write recovery delay or a row address to column address delay.

An apparatus is described. The following provides an overview of aspects of the apparatus as described herein:

Aspect 17: An apparatus, including: a processor; memory coupled with the processor; and instructions stored in the memory and executable by the processor to cause the apparatus to: truncate a value of a first parameter associated with a first duration for a clock coupled with a memory array to perform a clock cycle; determine a value of a second parameter that is inversely proportional to a combination of the truncated first parameter and a correction factor; determine a quantity of clock cycles associated with a second duration for accessing one or more memory cells of the memory array based at least in part on adjusting a third parameter associated with the second parameter; and access the one or more memory cells of the memory array based at least in part on the determined quantity of clock cycles.

Aspect 18: The apparatus of aspect 17, where the instructions are further executable by the processor to cause the apparatus to: receive a request to adjust a clock rate of the clock, where truncating the value of the first parameter is based at least in part on receiving the request.

Aspect 19: The apparatus of any of aspects 17 through 18, where the instructions to access the one or more memory cells of the memory array based at least in part on the determined quantity of clock cycles are executable by the processor to cause the apparatus to: access the one or more memory cells over a total quantity of clock cycles that is greater than or equal to the determined quantity of clock cycles.

Aspect 20: The apparatus of any of aspects 17 through 19, where the instructions are further executable by the processor to cause the apparatus to: truncate a value of the third parameter based at least in part on determining the value of the second parameter, where determining the quantity of clock cycles is based at least in part on truncating the value of the third parameter.

Aspect 21: The apparatus of any of aspects 17 through 20, where the instructions are further executable by the processor to cause the apparatus to: determine the third parameter based at least in part on combining the second parameter and a second correction factor, where adjusting the third parameter is based at least in part on determining the third parameter.

Aspect 22: The apparatus of any of aspects 17 through 21, where the second parameter is directly proportional to a fourth parameter associated with a total duration for performing a memory operation, and the instructions are further executable by the processor to cause the apparatus to: truncate a value of a fifth parameter to generate the fourth parameter.

Aspect 23: The apparatus of any of aspects 17 through 22, where the quantity of clock cycles corresponds to an upper bound of clock cycles for accessing the one or more memory cells.

Aspect 24: The apparatus of any of aspects 17 through 23, where the second duration for accessing the one or more memory cells corresponds to a write recovery delay or a row address to column address delay.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
truncating a value of a first parameter associated with a first duration for a clock coupled with a memory array to perform a clock cycle;
determining a value of a second parameter that is inversely proportional to a combination of the truncated first parameter and a correction factor;
determining a quantity of clock cycles associated with a second duration for accessing one or more memory cells of the memory array based at least in part on adjusting a third parameter associated with the second parameter; and
accessing the one or more memory cells of the memory array over a total quantity of clock cycles that is greater than or equal to the determined quantity of clock cycles based at least in part on the determined quantity of clock cycles.

2. The method of claim 1, further comprising:
receiving a request to adjust a clock rate of the clock, wherein truncating the value of the first parameter is based at least in part on receiving the request.

3. The method of claim 1, further comprising:
determining the third parameter based at least in part on combining the second parameter and a second correction factor, wherein adjusting the third parameter is based at least in part on determining the third parameter.

4. The method of claim 1, wherein the second parameter is directly proportional to a fourth parameter associated with a total duration for performing a memory operation, the method further comprising:
truncating a value of a fifth parameter to generate the fourth parameter.

5. The method of claim 1, wherein the quantity of clock cycles corresponds to an upper bound of clock cycles for accessing the one or more memory cells.

6. The method of claim 1, wherein the second duration for accessing the one or more memory cells corresponds to a write recovery delay or a row address to column address delay.

7. A method, comprising:
truncating a value of a first parameter associated with a first duration for a clock coupled with a memory array to perform a clock cycle;
determining a value of a second parameter that is inversely proportional to a combination of the truncated first parameter and a correction factor;
truncating a value of a third parameter based at least in part on determining the value of the second parameter;
determining a quantity of clock cycles associated with a second duration for accessing one or more memory cells of the memory array based at least in part on truncating the value of the third parameter; and
accessing the one or more memory cells of the memory array based at least in part on the determined quantity of clock cycles.

8. An apparatus, comprising:
a memory array comprising an array of memory cells that each comprise capacitive storage elements; and
a circuit coupled with the memory array and configured to cause the apparatus to:
truncate a value of a first parameter associated with a first duration for a clock coupled with the memory array to perform a clock cycle;
determine a value of a second parameter that is inversely proportional to a combination of the truncated first parameter and a correction factor;
determine a quantity of clock cycles associated with a second duration for accessing one or more memory cells of the memory array based at least in part on adjusting a third parameter associated with the second parameter; and
access the one or more memory cells of the memory array over a total quantity of clock cycles that is greater than or equal to the determined quantity of clock cycles based at least in part on the determined quantity of clock cycles.

9. The apparatus of claim 8, wherein the circuit is further configured to cause the apparatus to:
receive a request to adjust a clock rate of the clock, wherein truncating the value of the first parameter is based at least in part on receiving the request.

10. The apparatus of claim 8, wherein the circuit is further configured to cause the apparatus to:
truncate a value of the third parameter based at least in part on determining the value of the second parameter, wherein determining the quantity of clock cycles is based at least in part on truncating the value of the third parameter.

11. The apparatus of claim 8, wherein the circuit is further configured to cause the apparatus to:

determine the third parameter based at least in part on combining the second parameter and a second correction factor, wherein adjusting the third parameter is based at least in part on determining the third parameter.

12. The apparatus of claim 8, wherein the second parameter is directly proportional to a fourth parameter associated with a total duration for performing a memory operation, and the circuit is further configured to cause the apparatus to:

truncate a value of a fifth parameter to generate the fourth parameter.

13. The apparatus of claim 8, wherein the quantity of clock cycles corresponds to an upper bound of clock cycles for accessing the one or more memory cells.

14. The apparatus of claim 8, wherein the second duration for accessing the one or more memory cells corresponds to a write recovery delay or a row address to column address delay.

15. An apparatus, comprising:

a processor;

memory coupled with the processor; and instructions stored in the memory and executable by the processor to cause the apparatus to:

truncate a value of a first parameter associated with a first duration for a clock coupled with a memory array to perform a clock cycle;

determine a value of a second parameter that is inversely proportional to a combination of the truncated first parameter and a correction factor;

determine a quantity of clock cycles associated with a second duration for accessing one or more memory cells of the memory array based at least in part on adjusting a third parameter associated with the second parameter; and access the one or more memory cells of the memory array over a total quantity of clock cycles that is greater than or equal to the determined quantity of clock cycles based at least in part on the determined quantity of clock cycles.

16. The apparatus of claim 15, wherein the instructions are further executable by the processor to cause the apparatus to:

receive a request to adjust a clock rate of the clock, wherein truncating the value of the first parameter is based at least in part on receiving the request.

17. The apparatus of claim 15, wherein the instructions are further executable by the processor to cause the apparatus to:

truncate a value of the third parameter based at least in part on determining the value of the second parameter, wherein determining the quantity of clock cycles is based at least in part on truncating the value of the third parameter.

* * * * *